United States Patent [19]

Benzing et al.

[11] Patent Number: 4,657,616
[45] Date of Patent: Apr. 14, 1987

[54] IN-SITU CVD CHAMBER CLEANER

[75] Inventors: David W. Benzing; Jeffrey C. Benzing; Arthur D. Boren, all of San Jose; Ching C. Tang, San Francisco, all of Calif.

[73] Assignee: Benzing Technologies, Inc., San Jose, Calif.

[21] Appl. No.: 735,821

[22] Filed: May 17, 1985

[51] Int. Cl.4 .................. B44C 1/22; C03C 15/00; C03C 25/06

[52] U.S. Cl. .................. 156/345; 118/50.1; 118/620; 134/1; 134/22.1; 134/166 R; 156/643; 156/646; 204/298

[58] Field of Search ............ 156/345, 643, 646; 204/192 E, 298; 134/1, 22.1, 31, 37, 166 R, 201; 118/728, 50.1, 620; 427/38, 39

[56] References Cited

U.S. PATENT DOCUMENTS

| 4,123,316 | 10/1978 | Tsuchimoto | 156/643 |
| 4,123,663 | 10/1978 | Horiike | 250/531 |
| 4,138,306 | 2/1979 | Niwa | 156/643 X |
| 4,265,730 | 5/1981 | Hirose | 204/298 |
| 4,461,237 | 7/1984 | Hinkel | 118/50.1 |
| 4,500,563 | 2/1985 | Ellenberger | 427/38 |
| 4,529,474 | 7/1985 | Fujiyama et al. | 134/1 X |
| 4,576,698 | 3/1986 | Gallagher | 204/192 E |

FOREIGN PATENT DOCUMENTS

| 56-26539 | 3/1981 | Japan . |
| 56-258143 | 12/1981 | Japan . |
| 56-166935 | 12/1981 | Japan . |
| 57-13737 | 1/1982 | Japan . |
| 57-27024 | 2/1982 | Japan . |
| 57-69744 | 4/1982 | Japan . |
| 58-21826 | 2/1983 | Japan . |
| 58-171563 | 8/1983 | Japan . |
| 2062689 | 5/1981 | United Kingdom . |

OTHER PUBLICATIONS

D. Flamm and V. Donnelly, "The Design of Plasma Etchants", Plasma Chem. Plasma Process, B. pp. 317-363, (1981).
D. E. Ibbotson, J. A. Mucha, D. L. Flamm and J. M. Cook, "Plasamless Dry Etching of Silicon with Fluorine-Containing Compounds", J. Appl. Phys, 56(10), 2939-2942, (1984).

Primary Examiner—William A. Powell
Attorney, Agent, or Firm—Robert O. Guillot

[57] ABSTRACT

An apparatus for the in-situ cleaning of Low Pressure Chemical Vapor Deposition tube chambers (32) or Reduced Pressure Epitaxy bell jar chambers (42) having a base member (22) to create a vacuum seal upon engagement with the loading end of the chamber, at least one powered electrode (62) which protrudes from the base member into the chamber, at least on grounded electrode (60) which also protrudes from the base member into the chamber, a means for introducing gas (92) into the chamber, and an electrical network (16) that creates a radio frequency electrical field between the powered electrode and the grounded electrode. A plasma is created in the chamber by the interaction of the gas and the RF field, and the plasma etches unwanted deposits from the inner wall of the chamber. Several different configurations of electrode structures are shown.

19 Claims, 24 Drawing Figures

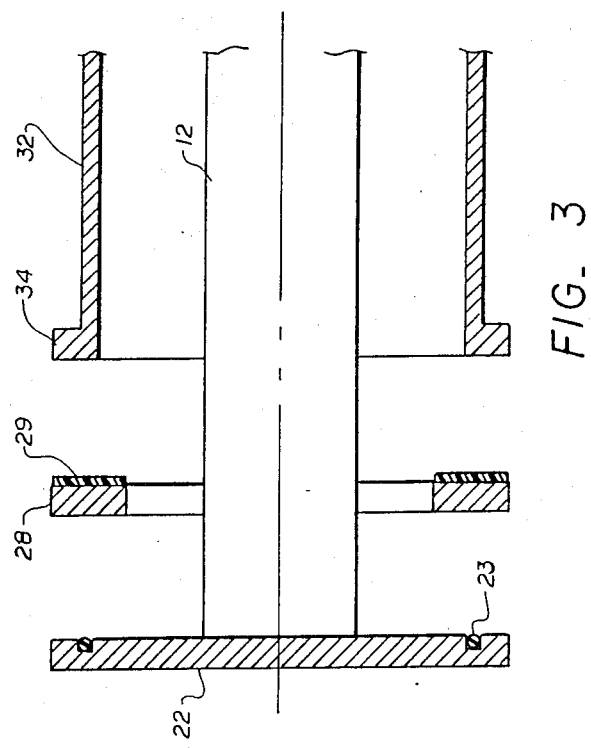

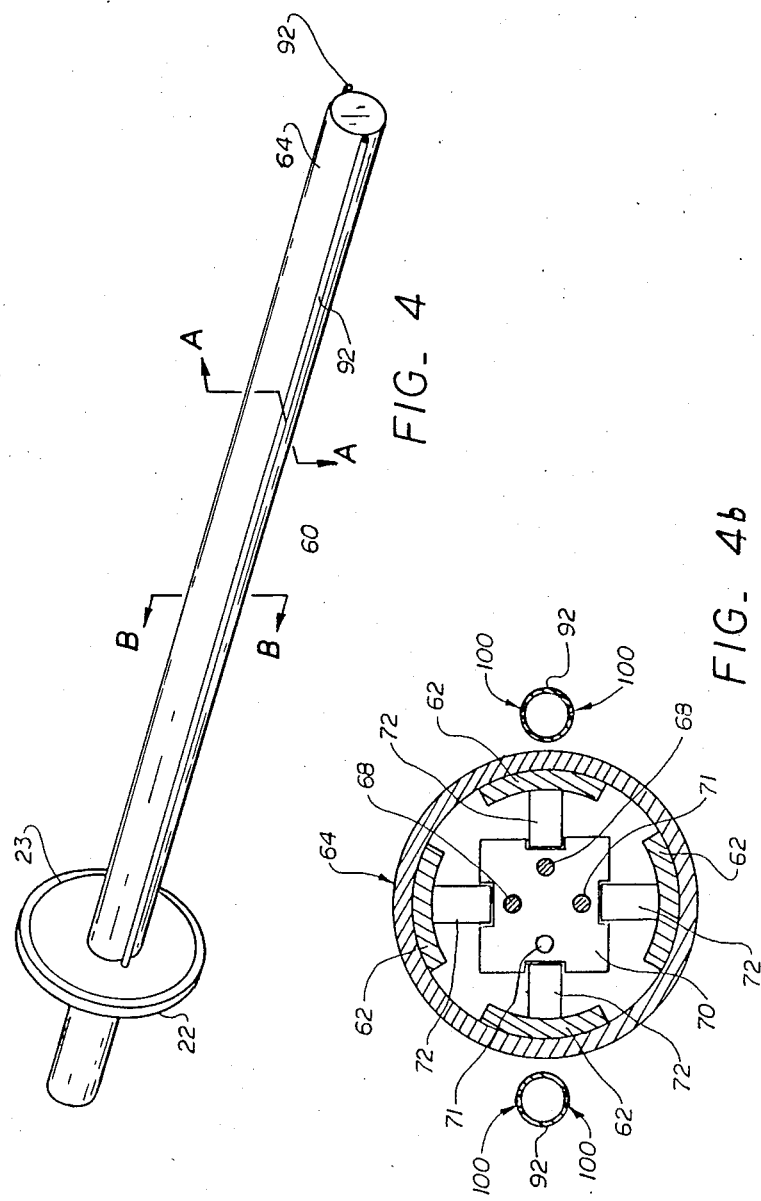

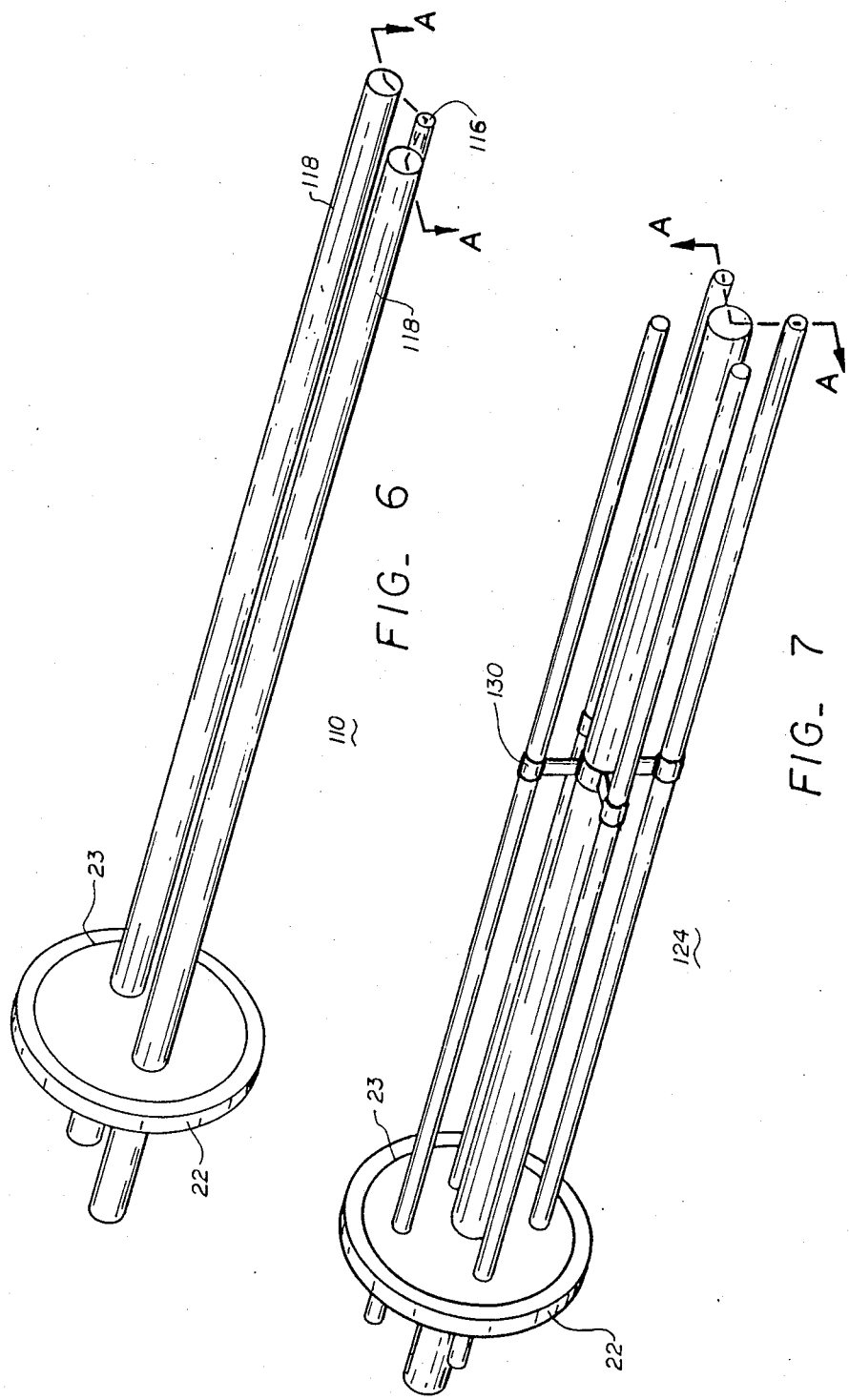

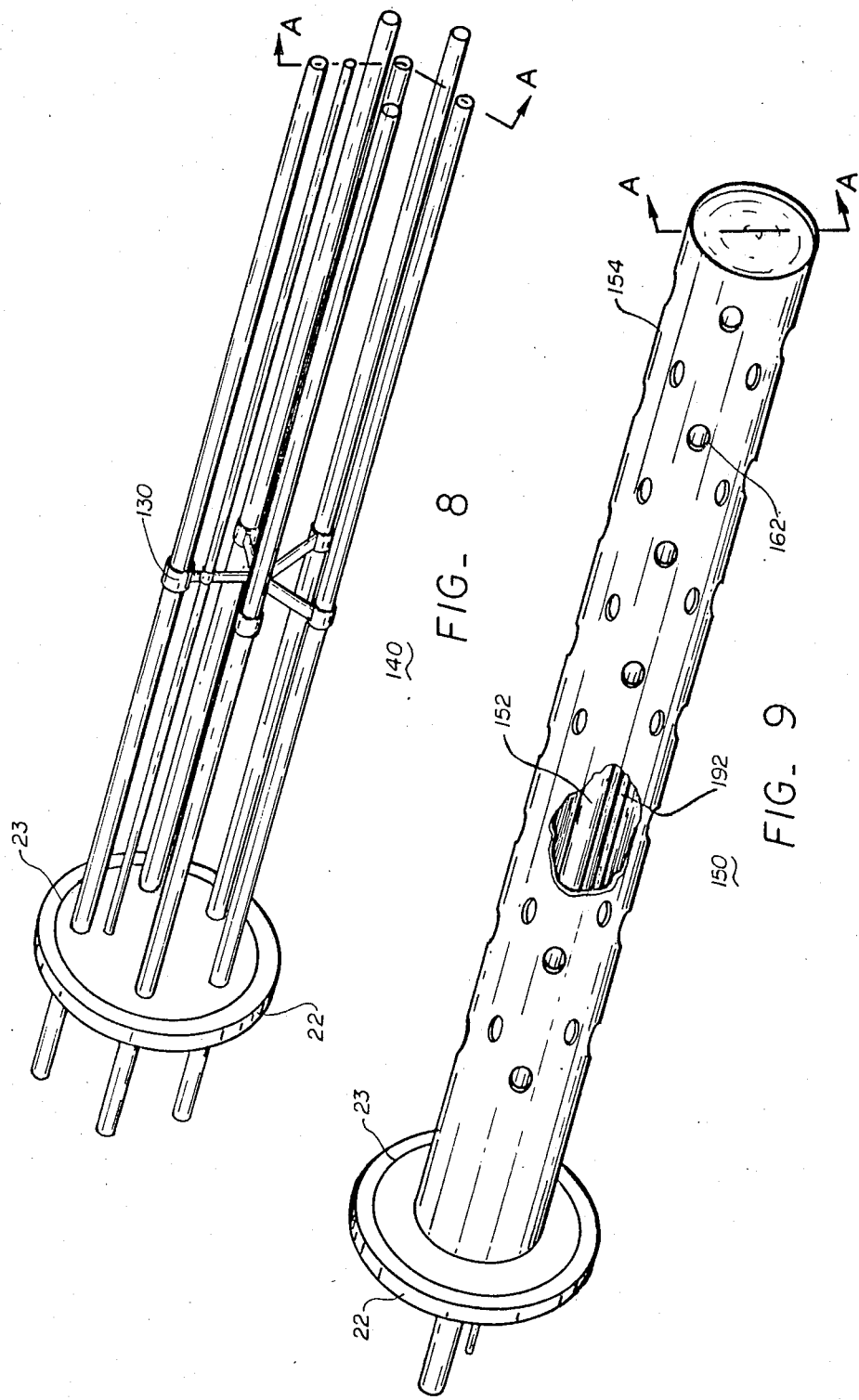

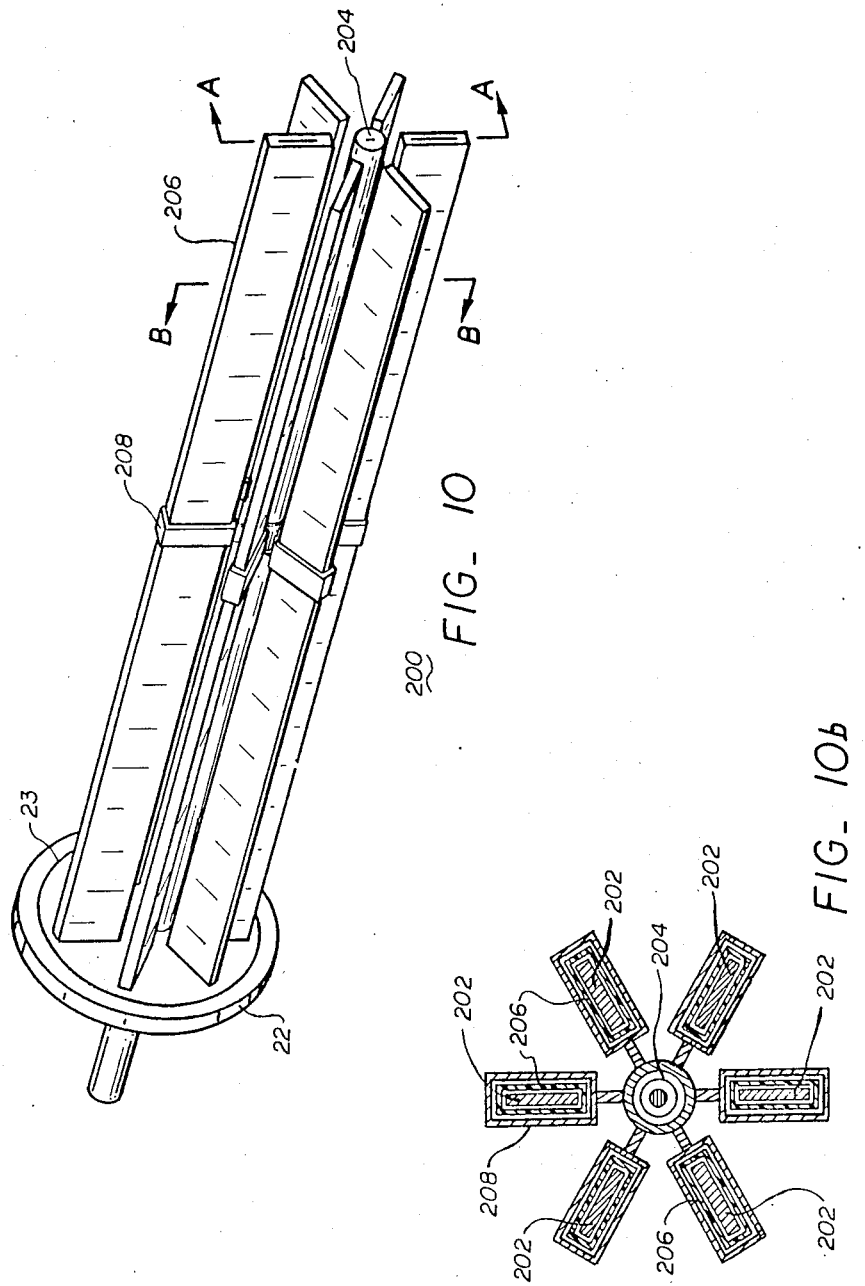

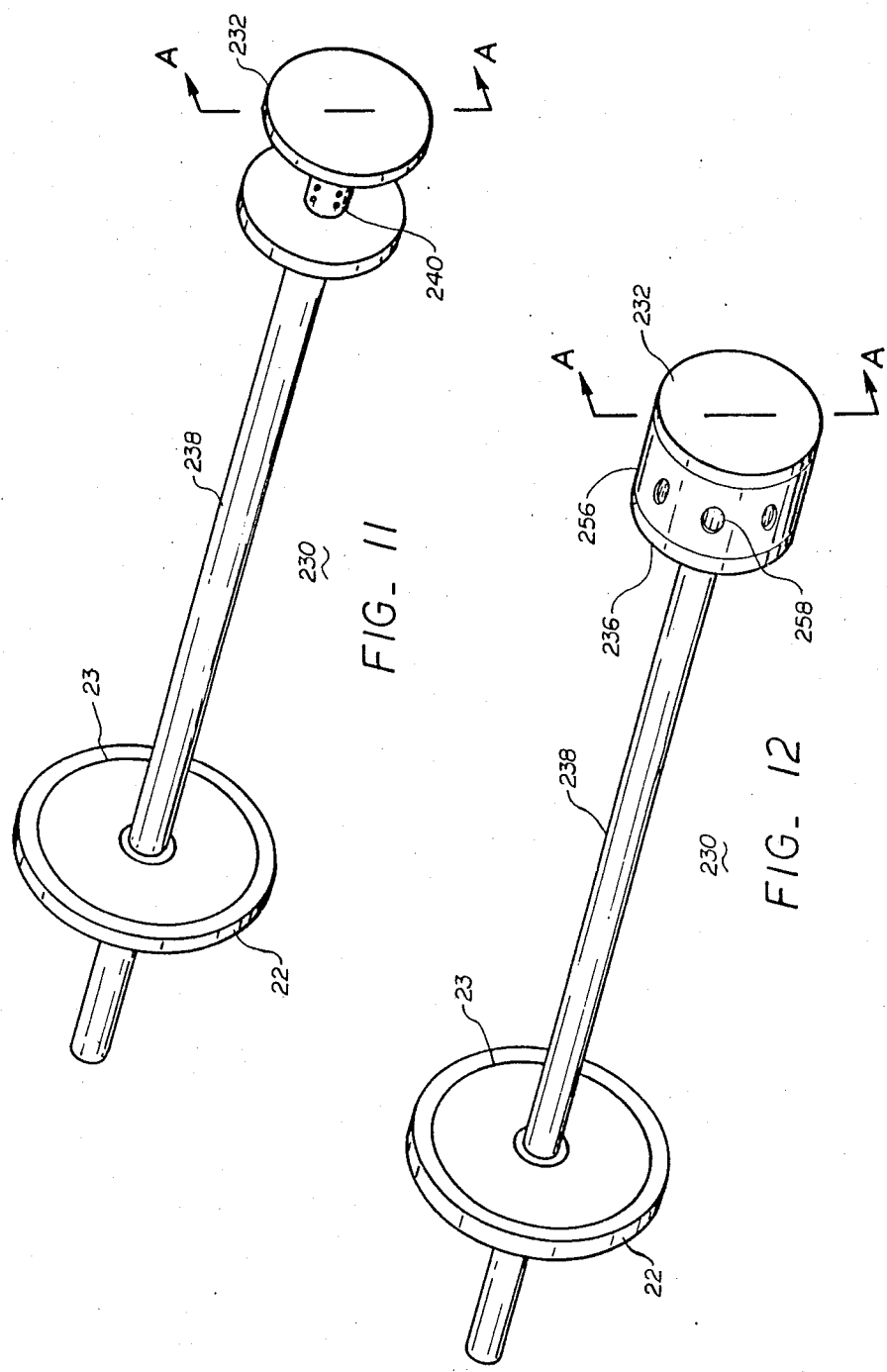

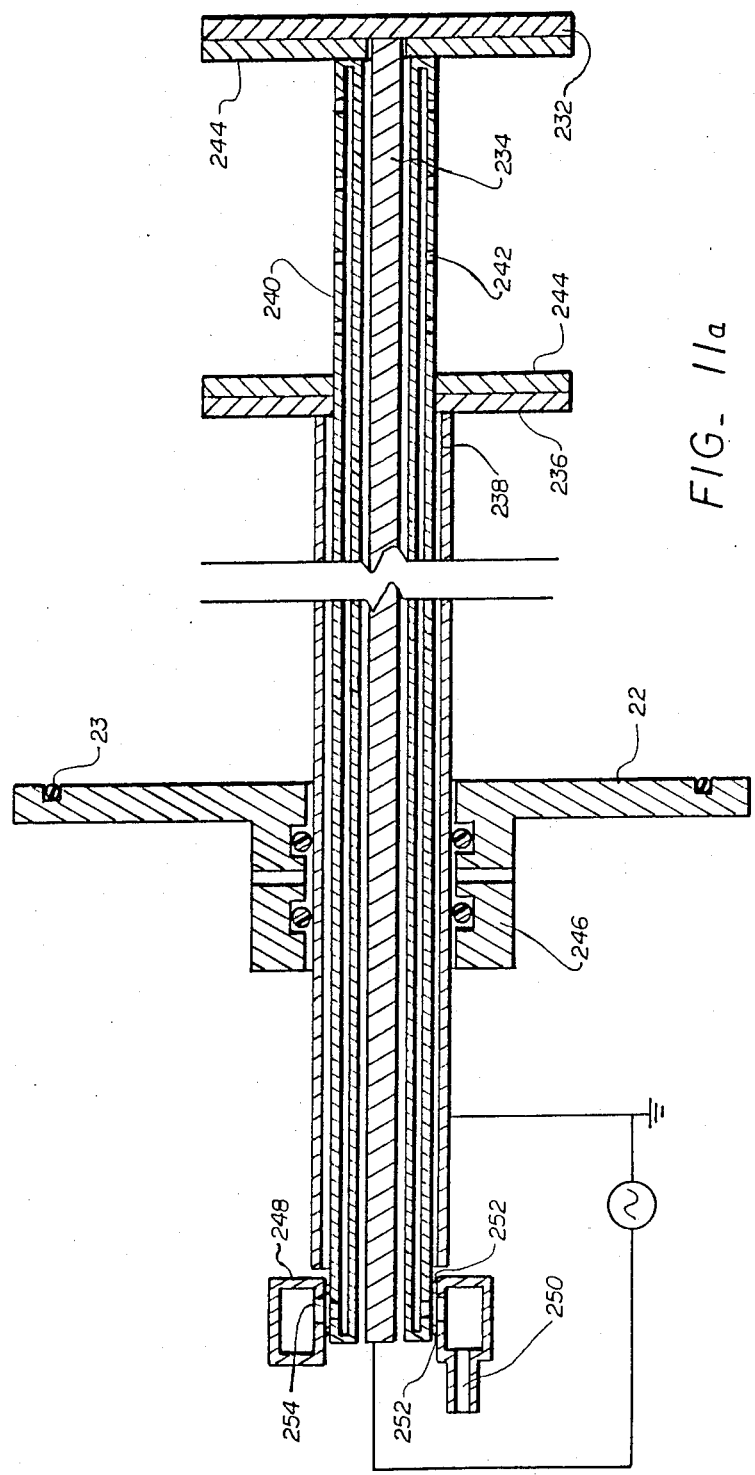

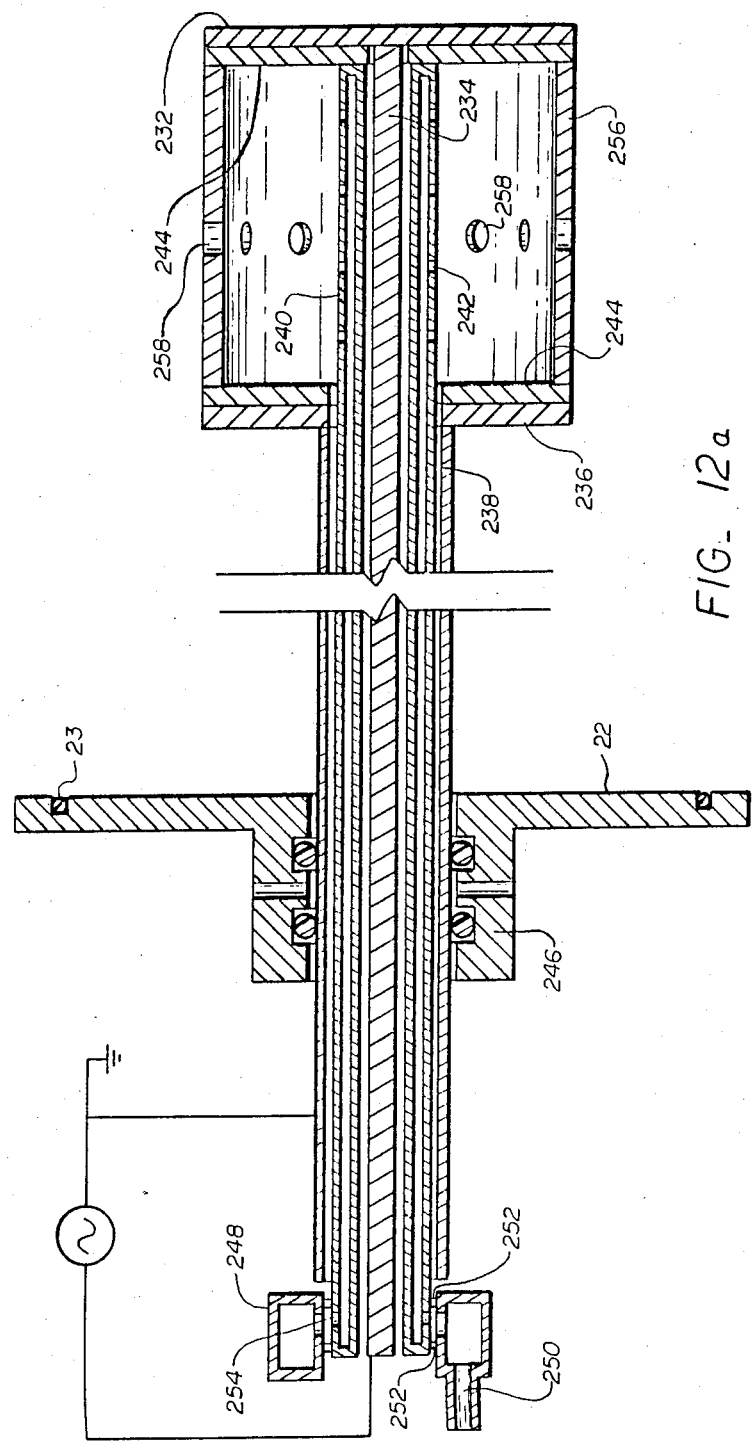

IN-SITU CVD CHAMBER CLEANER

FIELD OF THE INVENTION

The present invention relates generally to cleaning devices utilized to remove deposits from low pressure chemical vapor deposition chambers and, more particularly, to such devices which utilize a plasma formed within the deposition chamber to acheive such cleaning.

DESCRIPTION OF THE PRIOR ART

Low pressure chemical vapor deposition (LPCVD) and reduced pressure epitaxy (RPE) by chemical vapor deposition are widely used methods in the integrated circuit industry for the deposition of polysilicon, silicon nitride, silicon dioxide, single crystal silicon, and other films. LPCVD systems, as currently configured, employ a quartz tube situated in a furnace as the reaction chamber, while RPE systems employ a quartz bell jar. In LPCVE systems, wafers loaded into quartz boats are placed in the quartz tube which is heated to 400°-900° C. by the furnace (FIG. 1). The tube is evacuated and a mixture of gases is admitted. A chemical reaction takes place, resulting in the deposition of a film on all heated surfaces. Since the tube wall and the wafers are essentially at the same temperature, film deposition occurs on both the wafers and the tube wall. With each successive run, the wall deposit grows in thickness, becomes less adherent and begins to flake off. Particles thus created can lodge on the wafer surface and cause pinholes or non-uniform deposition. Periodic cleaning or replacement of dirty tubes is thus required to maintain system cleanliness and to avoid particle contamination. The situation is much the same for RPE, with the exception that the wafers and the susceptor on which they are placed are heated to 1100°-1200° C. by RF induction or radiant lamps. The quartz bell jar reactor vessel is air-cooled, and is therefore at a much lower temperature. Deposition nevertheless occurs on the inside surface of the bell jar and thus periodic cleaning is required.

There is no established standard frequency for the cleaning of LPCVD tubes or RPE bell jars in the industry, or even among manufacturers of these systems. The cleaning frequency varies according to film type and the maximum allowable particle level. For LPCVD polysilicon and silicon nitride, cleaning is performed after 10 to 50 runs or a 5 to 25 micron polysilicon or 1.5 to 7.5 micron silicon nitride deposit has accumulated. The LPCVD silicon dioxide process is more prone to particle generation, and cleaning is generally performed every 10 runs or 7-10 micron cumulative deposit. RPE bell jars are typically cleaned every 10 to 40 runs.

Currently, the most common approach to maintain LPCVD tube or RPE bell jar cleanliness is to remove the dirty tube or bell jar and replace it with a clean one. The dirty tube or bell jar is subsequently cleaned with acids or is discarded.

As illustrated in Table 1, the removal and replacement of dirty LPCVD tubes or RPE bell jars involves several steps, is time consuming and is costly. There are a number of problems inherent in this method which are summarized in Table 2.

Table 1
Conventional Methods of LPCVD Tube Cleaning

A. REPLACE TUBE
 1. Ramp down furnace temperature
 *2. Remove cantilever
 3. Disconnect vacuum and gas lines
 *4. Remove LPCVD tube from furnace
 5. Install clean LPCVD tube
 6. Connect vacuum and gas lines
 7. Leak check system
 *8. Install cantilever
 9. Ramp up furnace temperature
 10. Profile furnace temperature
 11. Perform test run
* if present B. HANDLING OF DIRTY TUBE
 1. Discard or
 2. Cut out dirty center section and weld in new section or
 3. Clean tube with acids, rinse and dry

TABLE 2
Disadvantages of Conventional Tube Cleaning Method

1. Procedure takes 4 to 16 hours
2. System downtime of 12 to 36%
3. Cost of $370 to $950 per tube clean
4. Removal of tube generates particles
5. Tubes often break upon removal
6. Tubes devitrify due to temperature cycling
7. Disconnection/reconnection of gas and vacuum lines causes leaks
8. Handling large tubes poses safety hazard
9. Use of acid for cleaning tubes poses safety and environmental hazards
10. Wet cleaning is ineffective for Si3N4

Most of the problems associated with the current method for cleaning LPCVD tubes and RPE bell jars stem from the fact that the tube must be removed from the system prior to cleaning. It is clear that an in-situ cleaning technique would eliminate these problems.

Attempts have been made previously to use gaseous HCl to remove polysilicon deposits from LPCV tubes and RPE bell jars by the reaction:

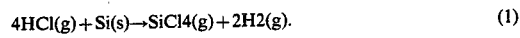

$$4HCl(g) + Si(s) \rightarrow SiCl_4(g) + 2H_2(g). \qquad (1)$$

This reaction, however, does not proceed rapidly except at temperatures above 900° C., thus requiring the LPCVD furnace temperature to be increased above its normal operating temperature of 600°-650° C. In RPE systems, where the bell jar temperature does not exceed 200° C., this method is ineffective. Furthermore, the polysilicon deposit is actually composed of sequential layers of polysilicon and silicon dioxide because each deposit of polysilicon undergoes surface oxidation during wafer load/unload. HCl does not react significantly with silicon dioxide and thus particles are created with this process. Lastly, HCl is a corrosive and toxic gas (Tolerance Level Value ±5 ppm).

Anhydrous HF can be used to effectively clean deposits of silicon nitride (see "Method of cleaning a Reactor", UK Patent Application No. 803009, GB2 062 689 A, Date of filing: Sept. 17, 1980, Applicant: NV Philips' Gloeilampenfabriken, Eindhoven, The Netherlands, Inventor: E. P. G. T. Van De Ven.) and silicon dioxide at elevated temperatures, but it is ineffective for polysilicon. Anhydrous HF is toxic (TLV=3 ppm) and extremely corrosive, requiring special plumbing materials and careful handling.

Other gases such as ClF3, BrF3, BrF5, and IF5 liberate atomic fluorine when heated (see D. E. Ibbotson, J.

A. Mucha, D. L. Flamm and J. M. Cook, *J. Appl. Phys.* 56, 2939 (1984)) and thus are effective in removing polysilicon deposits via the fluorination reaction:

$$4F(g) + Si(s) \rightarrow SiF_4(g). \qquad (2)$$

Silicon nitride and silicon oxide also react with atomic fluorine:

$$12F(g) + Si_3N_4(s) \rightarrow 3SiF_4(g) + 2N_2(g) \qquad (3)$$

$$4F(g) + SiO_2(s) \rightarrow SiF_4(g) + O_2(g). \qquad (4)$$

However, the highest halogens present in ClF3, BrF3, BrF5, and IF5 preferentially adsorb on silicon nitride and silicon dioxide surfaces, inhibiting the above fluorination reactions. Additionally, these gases are extremely toxic (TLV=0.1 ppm).

The implementation of in-situ cleaning techniques has therefore been hindered by the toxicity and corrosiveness of the gases involved and by their limited ability to etch one or more of the films.

Plasmas are well known for their ability to produce reactive species such as atomic fluorine from relatively nonreactive gases at temperatures far below that required for thermal decomposition. The application of plasma technology to in-situ chamber cleaning allows the use of less toxic and easier-to-handle gases and, for the first time, makes effective in-situ cleaning of LPCVD tubes and RPE bell jars a reality.

The proposed system would clean LPCVD tubes and RPE bell jars in situ, thereby eliminating the time needed for furnace cool-down and heat-up and significantly reduce the generation of particulates and the risk of tube or bell jar breakage associated with their removal. Further, it offers increased operator safety as it does not require the handling of large, hot quartzware or the use of acids. Table 3 summarizes the many benefits the proposed system offers over the current methods used to clean deposition chambers.

TABLE 3

Advantages of Autoclean 10 Use for Tube Cleaning

1. Tube removal is not required
2. Procedure takes 40 to 90 minutes
3. System downtime of 1 to 4%
4. Cost of $75 to $235 per tube clean
5. No particle generation
6. Gas and vacuum lines left intact
7. Furnace and tube left at temperature
8. Safe and easy to use
9. Semi-automatic operation In-situ cleaning of quartz tubes by means of a plasma has been demonstrated heretofore. The Plasma-Enhanced Chemical Vapor Deposition (PECVD) systems of Pacific Western Systems, Inc., Los. Gatos, CA and Advanced Semiconductor Materials, Inc., Phoenix, AZ, both employ LPCVD-like quartz tubes as reaction chambers. These tubes are situated horizontally in a furnace. An electrode/susceptor assembly is inserted into the tube and plasma deposition of silicon nitride, silicon oxide or polysilicon is performed. Typical operating temperature of the furnace is 200°-400° C. Deposition occurs on the wafers as well as on the electrode/susceptor assembly and the tubes walls. As in LPCVD, the deposit on the electrode/susceptor assembly and the tube walls must be periodically removed. Both manufactures indicate that this cleaning can be performed by insertion of the electrode/susceptor assembly without wafers into the tube and the creation of a plasma in a C2F6+O2 ambient. The atomic fluorine generated within the plasma removes the film as in reactions 2-4 above. The cleaning thus performed, however, is not complete and periodic removal and wet cleaning with acids of the tube and electrode/susceptor assembly must be performed. This is because the electrode/susceptor assembly is not configured for cleaning, rather for the deposition of films on wafers placed thereupon.

Several prior patents exist describing the in-situ cleaning of LPCVD tubes and other deposition chambers. Many (such as "Washing of Reactor For Plasma CVD Method", Japanese Pat. No. 57-27024(A), Mitsubishi Denki K.K., S. Tsuboi; "Plasma Chemical Vapor Deposition", Japanese Pat. No. 57-13737, S. Yamazaki; and "Plasma Reactor", Japanese Pat. No. 57-69744(A), Matsushita Denki Sangyo K.K., T. Kawaguchi.) describe the use of electrodes placed on the outside of the LPCVD tube to generate a plasma within the tube. The electrodes are either longitudinal along the entire length of the tube, or are circumferential, with one placed at either end of the tube. The electrodes thus placed can interfere with the uniform heating of the chamber and thus are not suitable for permanent installation on a production LPCVD system. Additionally, due to the greater ion bombardment that exists at or near the electrodes, the film removal is very nonuniform with these methods.

Several other patents (such as "Vacuum Vapor Deposition Apparatus", Japanese Pat. No. 56-258143(A), Mitsubishi Denki K.K.; "Reduced Pressure Chemical Phase Growth Device", Japanese Pat. No. 56-26539(A), Matsushita Senki Sangyo K.K., O. Ishikawa; and "Apparatus for Chemical Vapor Deposition", Japanese Pat. No. 56-166935(A), Mitsubishi Denki K.K.) describe the use of a plasma formed external to the LPCVD chamber. The reactant species formed in the plasma are transported by gas flow from the plasma into the LPCVD tube where they react with the wall deposits. This method suffers from extreme nonuniformity in film removal due to the limited lifetime of the reactive species. The lifetime of the species is much less than the time required to transport the specie from the plasma to the deposits at the far end of the LPCVD tube and thus etching of material there is much slower than near the front of the tube, closer to the plasma.

One patent ("Apparatus For Semiconductor Device Fabrication", Japanese Pat. No. 58-21826(A), Suwa Seikosha Co., Ltd.,) describes the use of an inductive coil within a quartz tube that is axially placed within an LPCVD tube. RF power applied to the coil causes a plasma to be formed within the LPCVD tube, exterior to the coil. This results in a plasma that is uniform both longitudinally and circumferentially. Inductive coils, however, produce relatively less intense plasmas, especially at frequencies below 2 MHz. Higher frequencies cannot be effectively used due to the coupling of the RF field into the furnace coils and, hence, into the facilities electrical network, causing disruption of computers, microprocessors and other electrical devices. Furthermore, the passage of current through the coil induces a magnetic field longitudinally along its exterior. The magnetic field "traps" electrons and ions near the surface of the coil, resulting in a radially nonuniform plasma. The plasma is more intense near the surface of the coil and thus the concentration of reactive species and the ion bombardment at the inner surface of the LPCVD tube is reduced resulting in a lower film removal rate.

IN THE DRAWINGS

FIG. 3 depicts an adaptor plate that can be used to facilitate the interface of the invention with various sizes of tubes;

FIG. 4 depicts an electrode configuration of the present invention;

FIG. 4b depicts a cross-sectional view of the electrode configuration of FIG. 4;

FIG. 6 depicts another alternative electrode embodiment of the present invention;

FIG. 7 depicts another alternative electrode embodiment of the present invention;

FIG. 8 depicts another alternative electrode embodiment of the present invention;

FIG. 9 depicts another alternative electrode embodiment of the present invention;

FIG. 10 depicts another alternative electrode embodiment of the present invention;

FIG. 10b depicts a cross-sectional view of the electrode configuration of FIG. 10;

FIG. 11 depicts another alternative electrode embodiment of the present invention;

FIG. 11a depicts a sectional view of the electrode configuration of FIG. 11;

FIG. 12 depicts another alternative electrode embodiment of the present invention;

FIG. 12a depicts a sectional view of the electrode configuration of FIG. 12.

DETAILED DESCRIPTION OF THE PREFERRED EMBODIMENT

Figure 1:
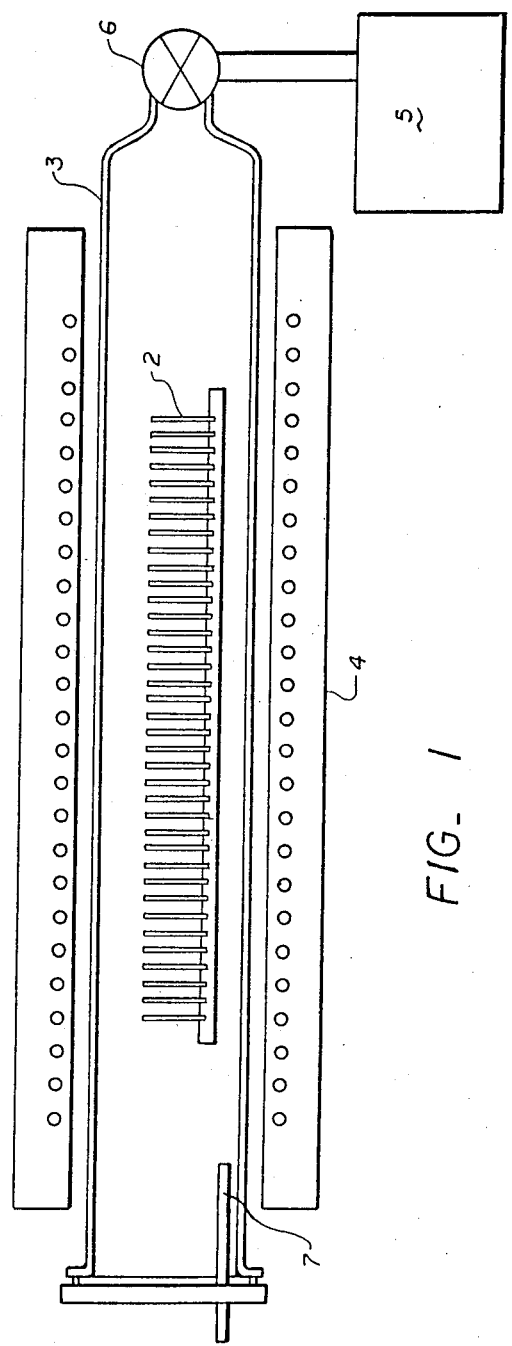
FIG. 1 depicts a generalized low pressure chemical vapor deposition system.

FIG. 1 depicts a generalized Low Pressure Chemical Vapor Deposition (LPCVD) system wherein wafers 2 are processed within a quartz LPCVD tube chamber 3 located within a furnace 4. The LPCVD tube 3 is evacuated to proper processing pressure utilizing a vacuum pump 5 and valve system 6, and processing gas is introduced through a suitable inlet 7.

Figure 2:
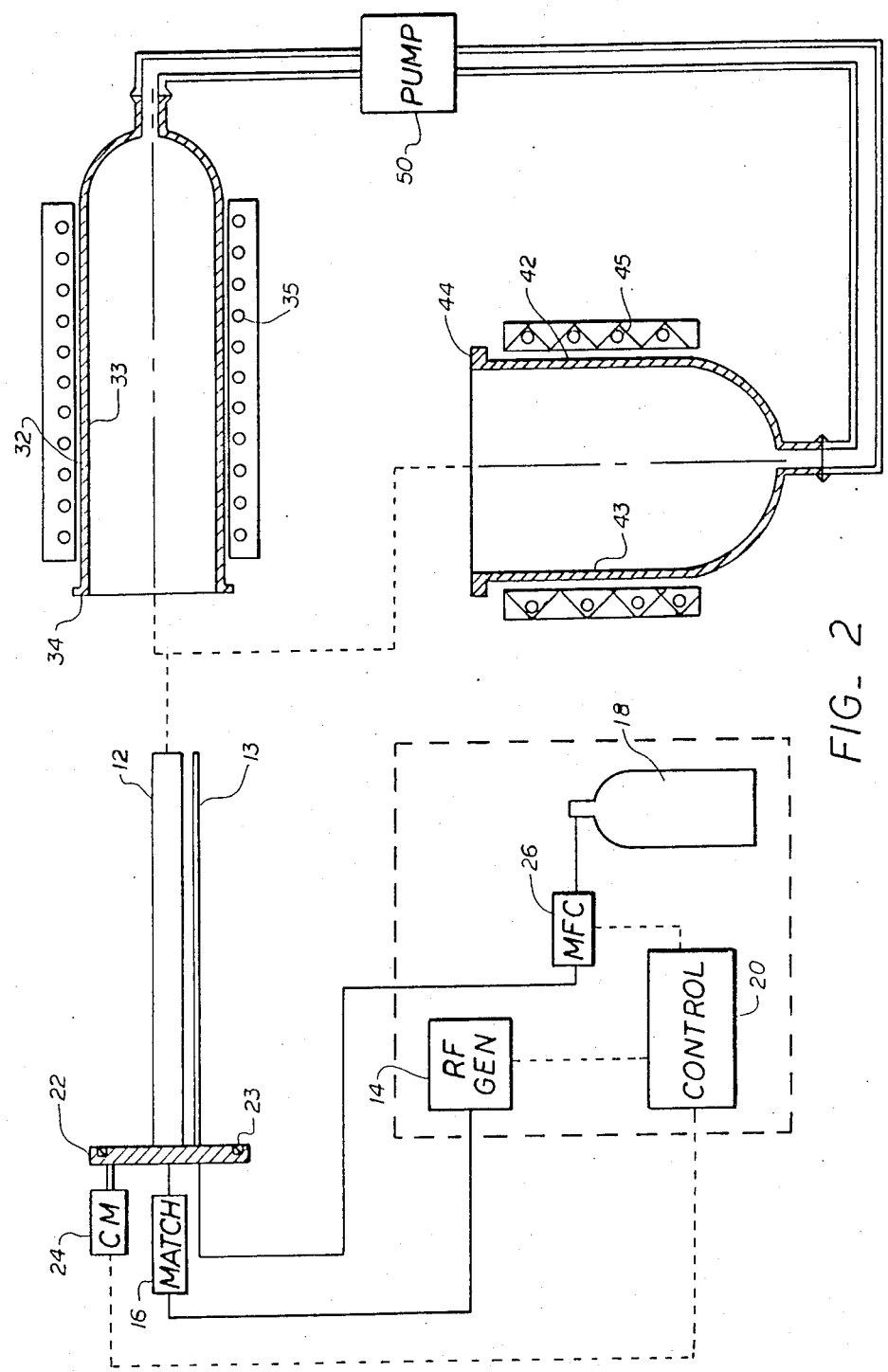
FIG. 2 depicts a schematic drawing of the present invention.

The system 10 is shown schematically in FIG. 2. It consists mainly of an electrode structure 12, an RF generator 14, matching network 16, an etch gas source 18 and a process controller 20. All may be mounted on a mobile cart to allow for servicing of several deposition chambers.

The electrode structure 12 is formed for insertion into an LPCVD tube 32 or RPE bell jar 42 to effect the cleaning of deposited material from the inner walls 33 or 43 thereof. The baseplate 22 of the electrode structure 12 has an o-ring seal 23 which matingly engages the base 34 of the tube 32 or the base 44 of the bell jar 42, such that a vacuum seal is created upon the evacuation of the tube or bell jar utilizing the vacuum pump system 50. A pressure detector 24, which may take the form of a capacitance manometer is utilized to measure the pressure within the tube or bell jar. A gas flow control device 26, which may take the form of a mass flow controller, is utilized to control the flow rate of etchant gas into the tube or bell jar. Gas is uniformly distributed in the LPCVD tube 32 or RPE bell jar 42 by a gas distribution tube 13. In order to make the system adaptible to various size tubes or bell jars, an adaptor plate 28 may be utilized (FIG. 3). The adaptor plate is doughnut-shaped to allow the passage of the electrode structure 12 through its center hole 30 and has an o-ring seal 29 which mating engages the base 34 of the tube 32 or the base 44 of the bell jar 42. The other side of the adaptor plate 28 matingly engages with the o-ring seal 23 of the baseplate 24 of the electrode structure 12.

To utilize the device, the electrode structure 12 is inserted into an LPCVD tube 32 or RPE bell jar 42 with the baseplate 22 of the electrode structure 12 making a vacuum tight seal with the loading end 34 of the tube 32 of the loading end 44 of the bell jar 42. The tube 32 or bell jar 42 is evacuated via its own pumping system 50, and gas is introduced into the tube 32 or bell jar 42 at a constant flow rate through gas distribution tubes 13. Gas flow is controlled by a mass flow controller. Several electrode structures and gas distribution tube configurations are discussed hereinafter. The gas may be such known gases as CF4, CF4+O2, C2F6+O2, SF6, or NF3. RF powr of 100 to 5000 watts at 50 to 2000 kilohertz is applied from the RF generator 14 through the matching network 16 to the electrode structure 12 creating a plasma within the tube 32 or bell jar 42. Etchant species created in the plasma react with the deposited material to form a volatile product which is pumped out of the tube 32 or bell jar 42 by the vacuum pumping system 50. Complete removal of the deposited material is detected via a rise in the pressure in the tube 32 or bell jar 42 as measured by a capacitance manometer.

Figure 4A:
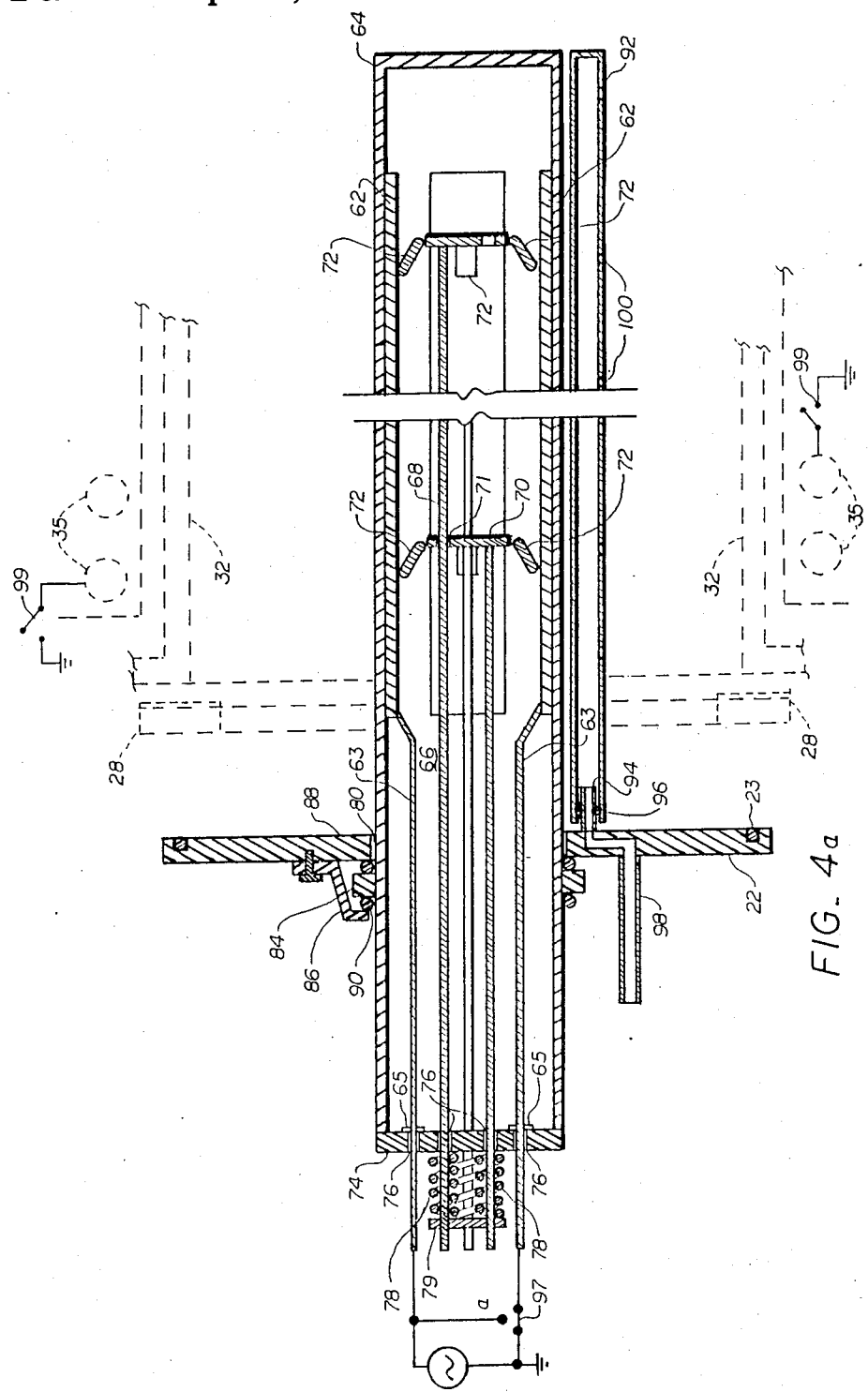
FIG. 4a depicts a sectional view of the electrode configuration of FIG. 4.

A first electrode structure 60 is shown in FIGS. 4, 4a and 4b. It consists of four electrodes 62 fixtured on the inner circumference of a single closed end quartz tube 64. The electrodes 62 are held against the inner wall of the quartz tube 64 by a spring-loaded, differential length, quad four-bar mechanism 66, which consists of four metal tension rods 68, each indiviually and rigidly connected to one of four metal pivot mounts 70. The pivot mounts 70 are each connected via pin joints to all four electrodes 62 by four ceramic links 72, which are preferably at a 30 to 45 degree from a radial vector. Each electrode 62 is rigidly connected to a metal electrode rod 63. The electrode rods 63 pass through clearance holes 76 in the ceramic load disk 74 and are buttressed against the ceramic load disk 74 by retaining rings 65. The four tension rods 68 pass through four clearance holes 76 in the disk 74. Four springs 78 are located coaxially, one to each tension rod 68 and are held in compression against the ceramic load disk 74 by retaining rings 79, thus placing each tension rod 68 in adjustable tension. The tensile force placed on each tension rod 68 is thus converted by this assembly into a radially outward force, pressing the electrodes 62 against the inner wall of the quartz tube 64. The pivot mounts 70 are located at different distances along the axis of the tube 64. The pivot mounts 70 have clearance holes 71 to allow tension rods 68 not connected to that particular pivot mount to pass through. The baseplate 22 is a doughnut-shaped metal plate possessing an o-ring seal 23. A formed quartz flange 84 is rigidly affixed on the outer circumference of the quartz tube 64 near its open end. The quartz tube 64 passes through the center hole 80 of the baseplate 22 which is of a diameter slightly larger than the quartz tube 64 but less than the quartz flange 84. The baseplate 22 is held to the quartz tube 64 and quartz flange 84 by means of four metal brackets 86. An o-ring 88 between the baseplate 22 and the quartz flange 84 provides for a vacuum tight seal, while another o-ring 90 between the quartz flange 84 and the metal brackets 86 is used to prevent breakage of the quartz. RF power is applied to two diametrically opposing electrodes 62 while the other two are grounded.

Etchant gas is introduced via two single closed end quartz gas distribution tubes 92 which are located on 180 degrees from each other on the outside of the quartz tube 64. The open end of each gas distribution tube 92 is fixtured coaxially over one of two metal gas input tubes 94 located on the baseplate 22. O-rings 96 are located between the outer circumference of the gas input tubes 94 and the inner circumference of the gas distribution tubes 92 and provide a leak-tight seal. The gas input tubes 94 pass through the baseplate 22 and are connected to a common gas manifold 98. Small holes 100 are fabricated in the walls of the gas distribution tubes 92. The holes 100 are distributed along the axial length of the gas distribution tubes 92 on either side of the gas distribution tubes 92 along a vector tangential to the quartz tube 64. This electrode design results in capacitive coupling to the plasma and yields a plasma that is uniform both axially and circumferentially and that is confined near the wall of the LPCVD tube or RPE bell jar. Etchant species created in the plasma diffuse to the chamber walls and volatilize any material deposited thereupon. Moreover, the electric field generated can couple to a degree with the furnace coils 35 or radiant lamps 45, thus achieving a relative degree of radial uniformity and ion bombardment of the LPCVD tube inner wall, which results in higher and more complete material removal from the walls.

Assuming that NF3 is used as the input gas, NF3 fragments in a plasma via the following reactions:

$$NF3 + e- \rightarrow NF2 + F + e- \quad (5)$$

$$NF3 + e- \rightarrow NF2 + F^- \quad (6)$$

$$NF3 + e- \rightarrow NF2 + F + 2e- \quad (7)$$

$$NF2 + e- \rightarrow NF + F + e- \quad (8)$$

$$NF + e- \rightarrow N + F + e- \quad (9)$$

Atomic fluorine thus created reacts with the deposited material to form volatile products:

$$Si(s) + 4F(g) \rightarrow SiF4(g) \quad (10)$$

$$Si3N4(s) + 12F(g) \rightarrow 3SiF4(g) + 2N2(g) \quad (11)$$

$$SiO2(s) + 4F(g) \rightarrow SiF4(g) + O2(g) \quad (12)$$

$$W(s) + 6F(g) \rightarrow WF6(g) \quad (13)$$

$$B(s) + 3F(g) \rightarrow BF3(g) \quad (14)$$

$$P(s) + 5F(g) \rightarrow PF5(g) \quad (15)$$

The reactions rates of (10) and (12) were calculated by Flamm et al (D. Flamm and V. Donnelly, *The Design of Plasma Etchants*, Plasm Chem. Plasma Process. 1, p. 317 (1981).) to be:

$$R(Si) = 2.9 \times 10^{-12} T^{\frac{1}{2}} N_F \exp(-0.108/kT) \quad (16)$$

$$R(SiO2) = 6.14 \times 10^{-13} T^{\frac{1}{2}} N_F \exp(-0.163/kT) \quad (17)$$

where T is the temperature in degrees Kelvin, $N_F$ is the concentration of F atoms, and k is Boltzmann's constant. For LPCVD applications, T is 700 to 1200 degrees K. Thus for a 50% fragmentation of NF3 into NF2+F alone at 1 torr pressure, $N_F$ is approximately $4 \times 10^{16}$/cc and the material removal rates for silicon and silicon dioxide are on the order of 20 microns/minute and 2 micron/minute, respectively. Atomic fluorine based etching of silicon nitride has shown its rate to be between that of silicon and silicon dioxide. Based on typical deposition thicknesses of 10 to 30 microns, one can see that these etch rates are more than sufficient to clean the tube in a very short time, provided a sufficient flux of reactant gas can be maintained. Table 4 calculates the feed gas supply required to remove polysilicon at 0.5 micron/minute. The calculated gas flow rate of 1.3 liter/minute can be easily handled by most LPCVD systems while maintaining a 2 torr pressure. Silicon nitride and silicon dioxide would require lower flows due to their lower density of silicon.

TABLE 4

Feed Gas Requirements

Amount Of Si To Be Removed:
Tube Diameter: 15 cm
Deposition Zone Length: 120 cm
Deposition Thickness: 15 microns
Volume of Silicon to be Removed: 8.5 cm3 (0.67 mole)
Gas Flow Required:
Assume 30' clean time.
Assume 50% reaction efficiency; 2.7 moles of NF3 etch 1 mole of Si.
Molar etch rate=0.67 mole/30 min.=0.022 mole/min.
NF3 required
 =0.06 mole/min.
 =1.3 liters/min.

For RPE applications, the temperature of the walls and thus the deposited silicon is typically 350 to 400 degrees K. The material removal rate calculated from (16) using the above assumptions is 1 micron/minute, demonstrating the feasibility of cleaning RPE bell jars in a short time.

A related configuration to that described in FIGS. 4, 4a and 4b is created by decreasing the number of electrodes 62 to two or increasing the number to six or any even number, where the electrodes are alternatively connected to RF power and ground.

Another embodiment of the electrode structure depicted in FIGS. 4, 4a and 4b is shown in phantom in FIG. 4a. It is created by connecting all the electrodes 62 to RF power by rotating switch 97 to pin a. In this embodiment the furnace coils 35, which are electrically connected to ground potential by the closing of switch 99, act as the sole ground electrode.

The electrode structure depicted in FIGS. 4, 4a and 4b, and all other electrode structures described herein can be adapted for use on either LPCVD tubes or RPE bell jars. Electrode structures configured for use on LPCVD tubes have baseplates and electrodes of smaller diameter and longer electrodes than those designed for RPE bell jars.

Figures 5, 5B:
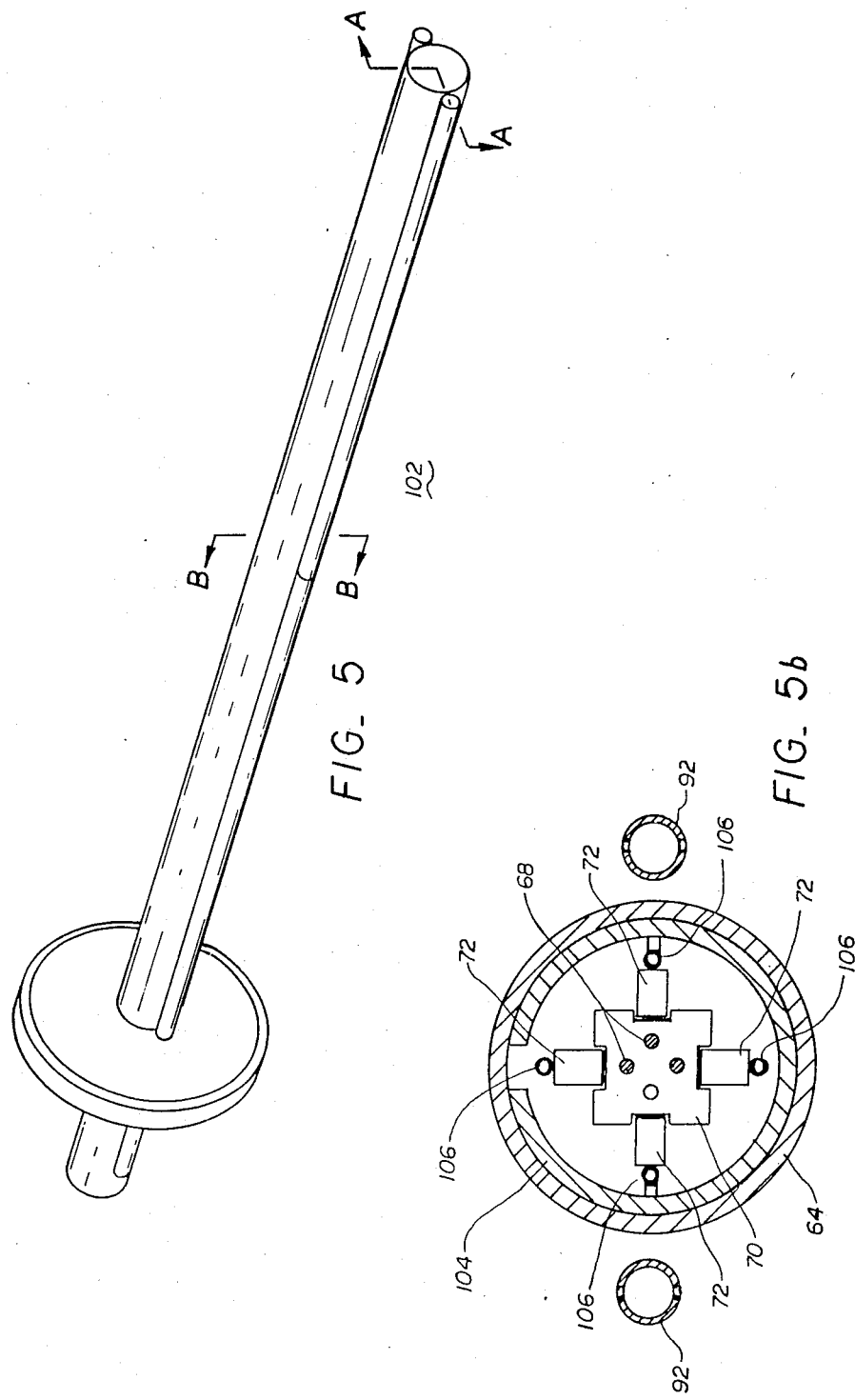
FIG. 5 depicts an alternative electrode embodiment of the present invention.
FIG. 5b depicts a cross-sectional view of the electrode configuration of FIG. 5.
Figure 5A:
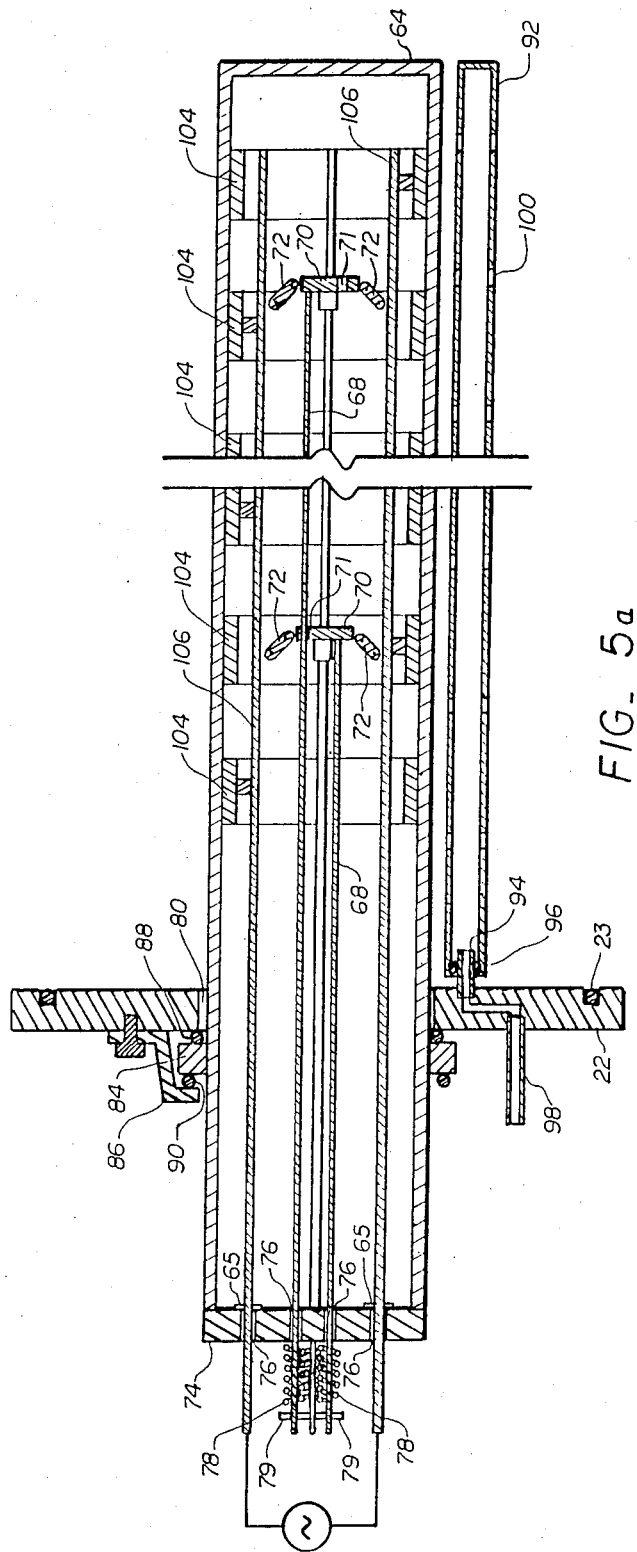
FIG. 5a depicts a sectional view of the electrode configuration of FIG. 5.

The electrode structure 12 can take many forms, several of which are described hereinafter. FIGS. 5, 5a and 5b depict and electrode structure 102 which is substantially similar to that depicted in FIGS. 4, 4a and 4b. In this embodiment, the rectangular electrodes 62 of FIG. 4, 4a and 4b are replaced by circumferential band electrodes 104, which are alternatively connected to RF power and ground. Each set of band electrodes is affixed to a pair of oppositely opposed conductive rods 106, which in turn are connected to a differential length, quad four bar mechanism 66 as in FIGS. 4, 4a and 4b. The conductive rods 106 are formed such that there is a air gap 108 between the rod 106 and the quartz tube 64 in those areas between the band electrodes 104 to which the rod 106 is attached.

As will be obvious to one ordinarily skilled in the art, the electrode configuration of FIGS. 5, 5a and 5b will function in much the same manner as the electrode structure depicted in FIGS. 2 and 4.

Figure 6A:
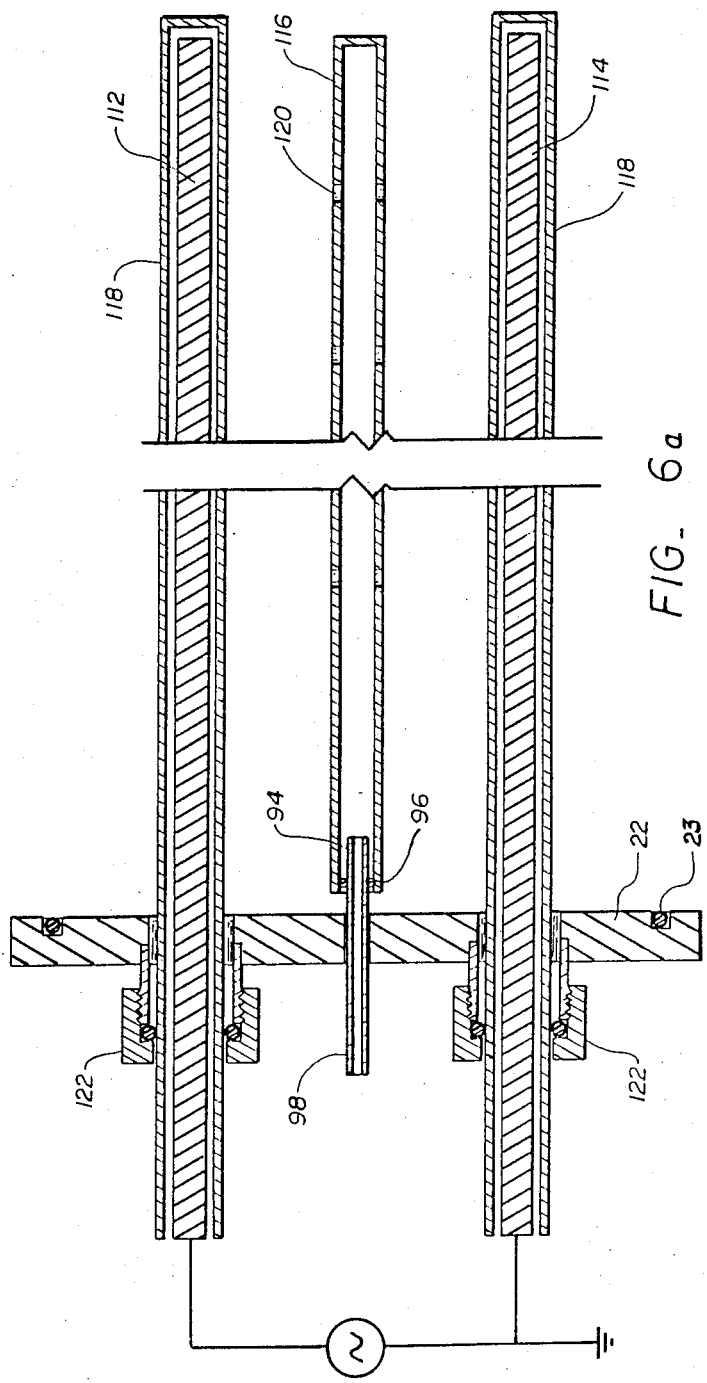
FIG. 6a depicts a sectional view of the electrode configuration of FIG. 6.

FIGS. 6 and 6a depict an electrode structure 110 having a powered electrode rod 112, a grounded electrode rod 114, and a gas distribution tube 116. Both electrode rods are sheathed in closed-end quartz tubes 118. The gas distribution tube 116 is formed with holes 120 to emit etchant gas into the tube 32 or bell jar 42 when the electrode structure 110 is inserted into the tube 32 or bell jar 42. Vacuum feedthroughs 122 for the electrode rods are formed in the baseplate 22 to provide vacuum integrity. The quartz sheath 118 on the powered electrode rod 112 isolates the powered electrode from the baseplate 22 and other components of the electrode structure. The gas distribution tube 116 is fixtured coaxially over the gas input tube 94 and sealed by an o-ring 96. The gas input tube is coupled to the gas manifold 98 through the baseplate 22.

Another form of the electrode structure that is depicted in FIGS. 6 and 6a is created when the electrode rods 112 and 114 are formed from such a material such as graphite, silicon, tungsten, molybdenum, or titanium that is electrically conductive and that reacts with atomic fluorine to form a volatile compound. In this form, the quartz electrode sheaths 118 are not used. The electrode rods 112 and 114 may take the form of single-closed-end tubes or solid rods.

As should be obvious to one skilled in the art, the electrode structure of FIGS. 6 and 6a will function in a substantially similar manner to that depicted in FIGS. 2 and 4.

Figure 7A:
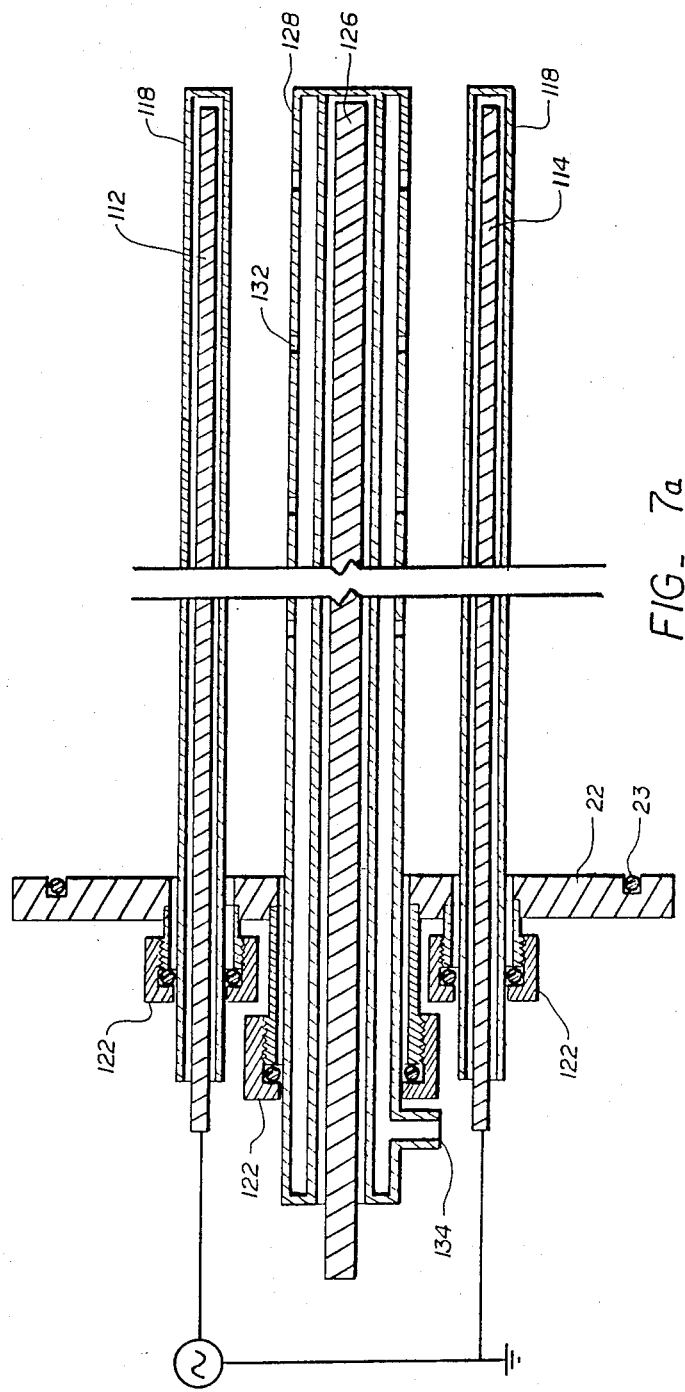
FIG. 7a depicts a sectional view of the electrode configuration of FIG. 7.

FIGS. 7 and 7a depict an electrode structure 124 which is an alternate form of the electrode structure in FIG. 6, where an even number of electrode rods 112 sheathed in closed-end quartz tubes 118 are used and number more than 2. The rods 112 are connected alternately to RF power and ground. A ceramic rod 126 covered by a dual-wall quartz sheath 128 is placed centrally and is used to support the electrode rods by means of a quartz "spider" 130. The outer wall of the dual-wall quartz sheath 128 is formed with holes 132 to emit etchant gas into the tube 32 or bell jar 42 when the electrode structure 124 is inserted within the tube 32 or bell jar 42. Etchant gas is injected into the interstitial space of the dual-wall quartz sheath 128 through the gas injection port 134. The dual-wall quartz sheath 128 and quartz tubes 118 penetrate the baseplate 22 via vacuum feedthroughs 122.

Another form of electrode structure is that depicted in FIGS. 7 and 7a where all of the electrode rods 112 and 114 are connected to RF power and the furnace coils 35 or radiant lamps 45 are used as ground.

Another form of the electrode structure that is depicted in FIGS. 7 and 7a is created when the electrode rods 112 and 114 are formed from such a material such as graphite, silicon, tungsten, molybdenum, or titanium that is electrically conductive and that reacts with atomic fluorine to form a volatile compound. In this form, the quartz electrode sheaths 118 are not used. The electrode rods 112 and 114 may take the form of single-closed-end tubes or solid rods.

As will be obvious to one ordinarily skilled in the art, the electrode configurations of FIGS. 7 and 7a will function in much the same manner as the electrode structure depicted in FIGS. 2 and 4.

Figure 8A:
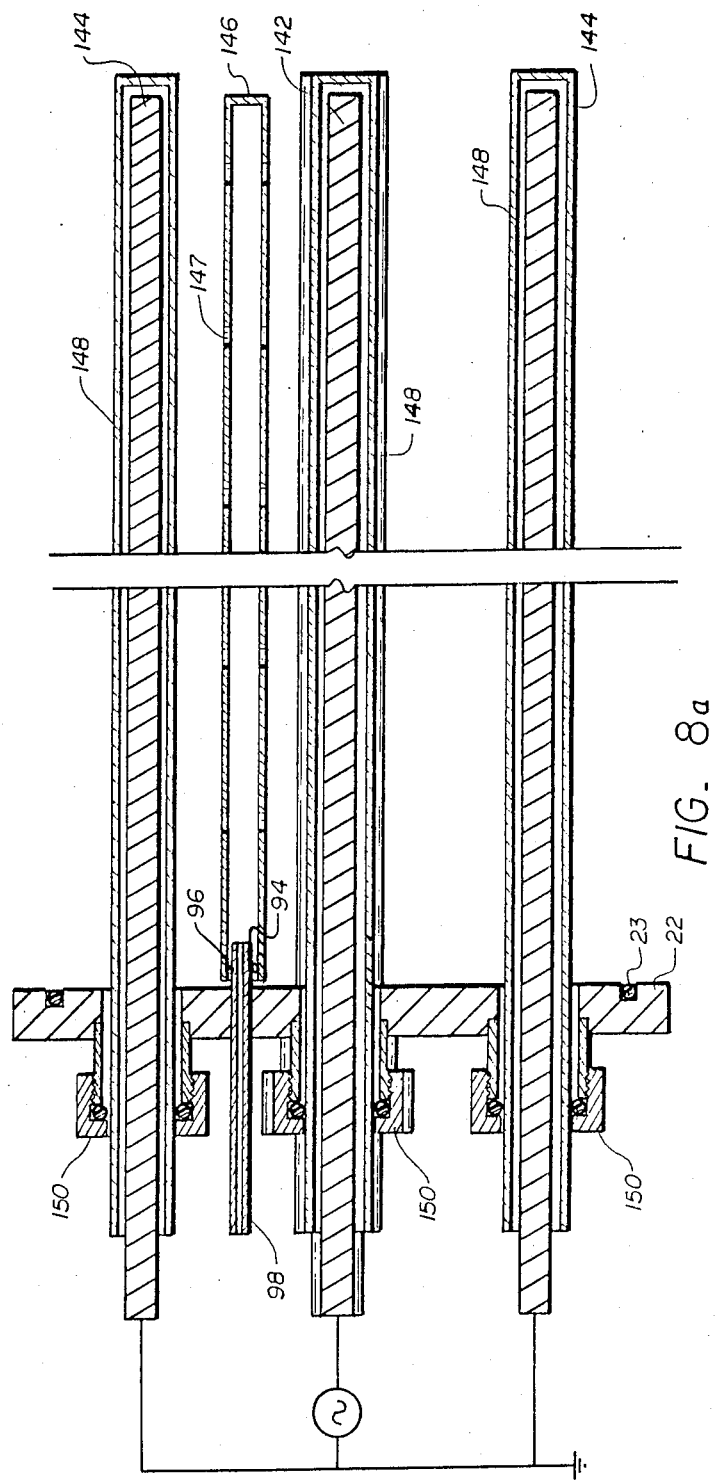
FIG. 8a depicts a sectional view of the electrode configuration of FIG. 8.

FIGS. 8 and 8a depict another electrode structure 140. A single powered electrode 142 protrudes from the center of baseplate 22. Several grounded electrodes 144, five of which are depicted in FIGS. 8 and 8a, are radially and circumferentially disposed about the powered electrode 142. A gas injection tube 146 formed with holes 147 is circumferentially disposed proximate the powered electrode 142 and grounded electrodes 144. The gas injection tubes 146 is coaxially affixed over the gas input tube 94 and sealed to it via an o-ring 96. The gas input tube is connected to the gas manifold 98 through the baseplate 22. The precise location of the gas injection tube 146 is not significant as long as it emits gas in the vicinity of the powered and grounded electrodes. All electrodes are covered with single-closed-end quartz sheaths 148. A quartz "spider" 130 interconnects all the quartz sheaths 148 to maintain the geometry of the structure and strengthen it. Vacuum feedthroughs 150 are formed in the baseplate 22 to allow passage of the quartz sheaths 148 and electrodes 140 and 142 through the baseplate 22 while maintaining vacuum integrity. The quartz sheath 148 on the powered electrode 140 acts as a insulator to isolate it from the baseplate 22 and the other components of the electrode structure 140.

A related configuration to that described in FIGS. 8 and 8a is created by reversing the electrical power geometry of the electrodes. That is, the outer, previously grounded electrodes 144 are powered and the previously powered electrode 142 is grounded. In this alternative embodiment, each of the powered electrodes 144 is insulated from the baseplate 22 by means of the quartz sheaths 148.

Another embodiment of the electrode structure depicted in FIGS. 8 and 8a is created when the electrodes 142 and 144 are formed from material such as graphite, silicon, tungsten, molybdenum or titanium that is electrically conductive and that reacts with atomic fluorine to form a volatile compound. In this alternative embodiment, a high voltage vacuum feedthrough should be used to connect the RF power to the the powered electrode 142 through the baseplate 22. The electrodes 142 and 144 can be made from single-closed-end tubes or solid rods.

As will be obvious to one ordinarily skilled in the art, the electrode configuration of FIGS. 8 and 8a will function in much the same manner as the electrode configurations depicted in FIGS. 2 and 4 with the exception that the electric field thus generated is primarily confined to the annular region between the powered and grounded electrodes and thus ion bombardment of the LPCVD tube walls is reduced.

Figure 9A:
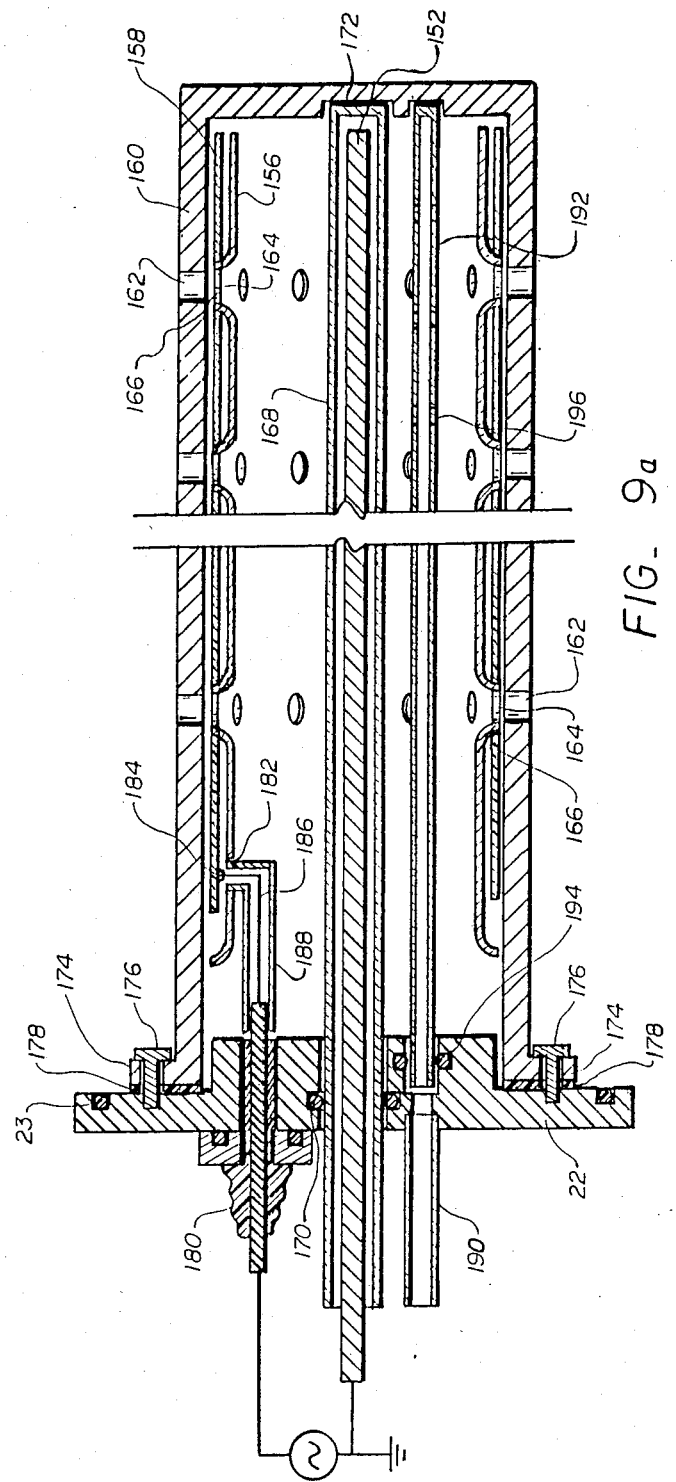
FIG. 9a depicts a sectional view of the electrode configuration of FIG. 9.

FIGS. 9 and 9a depict another electrode structure 150. It consists of a center rod 152 surrounded by a perforated cylinder 154. The cylinder 154 is composed of an inner quartz wall 156, a middle metal central sleeve 158 and an outer closed-end ceramic support 160. The perforations 162 are formed colinearly in the quartz sleeve 156, the metal sleeve 158 and the ceramic support 160. The perforations 164 of the quartz sleeve 156 are formed with a slight flare in the outward radial direction, while the perforations 166 in the metal sleeve 158 are of a greater diameter than the flare of the perforations 164 so that upon assembly the metal sleeve is effectively isolated from the gaseous ambient. The center rod 152 is sheathed in a single-closed-end quartz tube 168 and is supported by the vacuum feedtrough 170 on the baseplate 22 at one end and the end 172 of the ceramic support at the other. The opposing end 174 of the ceramic support is flared and is connected to the baseplate 22 by means of bolts 176 and teflon spacers 178. RF power is fed through the baseplate 22 by means on a high voltage vacuum feedthrough 180 and is connected to the metal sleeve with a bolt 182 at the connection point 184. The RF power line 186 is covered by a teflon sheath 188. Etchant gas is input into the electrode structure 150 through the gas distribution tube 192 that is formed with holes 196. The gas distribution tube is coaxially affixed to the gas input tube 190 at the baseplate 22 and is sealed with an o-ring 194. This "hollow cathode" design results in an intense plasma. Etchant species created in the plasma flow through the perforations 162 in the cylinder 154 and to the chamber walls for cleaning.

An alternate configuration to that described in FIGS. 9 and 9a is created by reversing the electrical power geometry. That is, the previously powered metal sleeve 158 is now grounded and the previously grounded center rod 152 is now powered.

Another embodiment of the electrode structure depicted in FIGS. 9 and 9a is created by forming the metal sleeve 158 and center rod 152 from a material such as graphite, polysilicon, tungsten, molybdenum or titanium that is electrically conductive and that reacts with atomic fluorine to form a volatile compound. In this embodiment, the inner quartz sleeve 156 and center rod quartz sheath 168 are not required.

As will be obvious to one ordinarily skilled in the art, the electrode configuration of FIGS. 9 and 9a will function in much the same manner as the electrode configurations depicted in FIGS. 2 and 8.

Figure 10A:
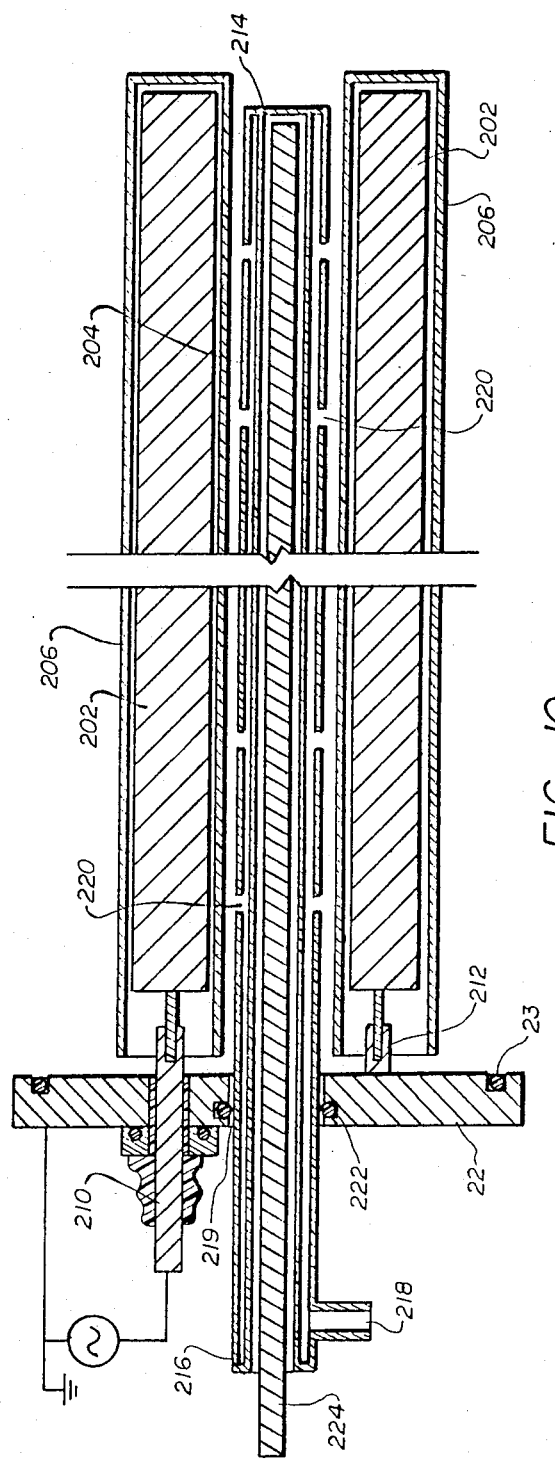
FIG. 10a depicts a sectional view of the electrode configuration of FIG. 7.

FIGS. 10, 10a and 10b depict another electrode structure 200. It consists of an even number of electrode plates 202, six of which are shown in FIGS. 10, 10a and 10b, located radially and circumferentially to a center, dual-wall quartz tube 204. The electrode plates 202 are covered by rectangular quartz sheaths 206. The electrode plates 202 and sheaths 206 are supported by the center tube 204 by means of a quartz "spider" 208. At the baseplate 22, the powered electrode plates 202 are attached to the threaded ends of high voltage vacuum feedthroughs 210, while the grounded electrode plates 202 are attached to the threaded ends of conductive rods 212, which in turn are affixed to the baseplate 22. The quartz sheaths 206 extend beyond the electrode plates 202 to cover the vacuum feedthrough rods 210 and grounded conductive rods 212. The center quartz tube 204 is formed with two walls. The end 214 of the quartz tube 204 away from the baseplate is sealed, while at the baseplate end 216, the annular space is sealed and formed with a gas injection port 218. The outer wall of the dual-wall quartz tube is formed with holes 220 to emit etchant gas into the tube 32 or bell jar 42 when the electrode structure 200 is inserted within the tube 32 or bell jar 42. The holes 220 are located so as to emit gas into each of the spaces formed by a pair of electrode plates 202. The dual-wall quartz tube passes through a circular hole 219 in the baseplate 22 and is sealed with and o-ring 222. A ceramic rod 224 is situated in the center of the quartz tube 204 to provide strength.

Another embodiment of the electrode structure depicted in FIGS. 10, 10a and 10b is created by forming the electrode plates 202 from a material such as graphite, polysilicon, tungsten, molybdenum or titanium that is electrically conductive and that reacts with atomic fluorine to form a volatile compound. In this embodiment, the quartz sheaths 206 are not required.

As will be obvious to one ordinarily skilled in the art, the electrode configuration of FIGS. 10, 10a and 10b will function in much the same manner as the electrode configurations depicted in FIGS. 2 and 8.

FIGS. 11 and 11a depict yet another electrode structure 230. A powered, circular electrode plate 232 is affixed to rod 234. A grounded, circular electrode plate 236 is affixed to the end of hollow rod 238. The powered rod 234 resides coaxially within the grounded rod 238 and is electrically insulated therefrom by the dual-wall, quartz gas injection tube 240. The gas injection tube is dual-wall to allow the passage of etchant gas through its annular space and be emitted through holes 242 in the outer wall of the tube 240 located in the region between the electrode plates 232 and 236. Circular quartz plates 244 are affixed to the gas distribution tube 240 such that each is adjacent to an electrode plate 232 or 236. The coaxial assembly consisting of rods 234 and 238 together with gas distribution tube 240 pass through the baseplate 22 by means of a differentially-pumped, linear motion, vacuum feedthrough 246 which is utilized to allow the gradual axial insertion of the electrode structure 240 throughout the length of the tube 32 or bell jar 42 without degrading the vacuum within the tube 32 or bell jar 42. Gas is introduced into the gas distribution tube outside the baseplate 22 by means of a hollow collet 248 with gas injection port 250 and o-rings 252. The collet 248 is positioned over the gas injection hole 254 in the outer wall of the gas distribution tube 240. The application of power to rod 234 and thus to electrode plate 232 will result in the creation of a plasma between the plates 232 and 236. The relatively restricted volume between the plates 232 and 236 produces a relatively intense plasma which is directed towards deposited material on the innner wall 33 of the tube 32 or 43 of the bell jar 42, primarily in the area of the wall 33 or 43 located between the plates 232 and 236. Thus, a relatively enhanced cleaning of localized areas is accomplished by the configuration depicted in FIGS. 11 and 11a. Axial movement of the electrode structure 240 within the tube 32 or bell jar 42 thus results in cleaning of the inner wall 33 or 43 in an incremental fashion and allows for enhanced application of the plasma to particularly heavily deposited regions of the inner wall.

FIGS. 12 and 12a depict yet another electrode structure which is basically derived from that structure depicted in FIGS. 11 and 11a. The additional features of the embodiment depicted in FIGS. 12 and 12a is the cylindrical plasma containment sleeve 256. The sleeve 256 is formed with holes 258 through the surface thereof to allow species created in the plasma to radiate therethrough. The sleeve 256 may be formed of quartz or similar high temperature insulative material. The holes 258 are of small enough diameter so as to sustain a substantial pressure difference across them and thus act as nozzles to direct the plasma species at relatively high velocities in a radial fashion towards the inner wall 33 or 43 of the tube 32 or bell jar 42. As with the embodiment depicted in FIGS. 11 and 11a, a differentially-pumped, linear motion, vacuum feedthrough 246 is utilized in the baseplate 22 to allow the gradual axial insertion of the electrode structure.

As will be obvious to one ordinarily skilled in the art, the electrode configuration of FIGS. 12 and 12a will function in much the same manner as the electrode configurations depicted in FIGS. 2 and 11.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A chemical vapor deposition chamber cleaning system for the in-situ cleaning of LPCVD tube chambers or RPE bell jar chambers comprising:
    a base member formed to create a vacuum seal upon engagement with the loading end of said chamber;
    at least one powered electrode formed to protrude from said base member into said chamber and to extend substantially throughout the length of said chamber;
    at least one grounded electrode formed to protrude from said base member into said chamber and to extend substantially throughout the length of said chamber;
    a means for introducing a plasma forming gas into said chamber;
    a means to evacuate said chamber such that a plasma can be created within said chamber;
    an electrical network formed to create a radio frequency electrical field between said powered electrode and said grounded electrode, whereby a plasma is created in said chamber by the interaction of said gas and said RF field, said plasma acting to etch unwanted deposits from the inner wall of said chamber.

2. A chemical vapor deposition chamber cleaning system as described in claim 1 wherein each of said electrodes are composed of a conductive material that is sheathed within a tube composed of a dielectric material that does not substantially react with said gas or said plasma.

3. A chemical vapor deposition chamber cleaning system as described in claim 2 wherein one powered electrode and one grounded electrode are disposed within said chamber.

4. A chemical vapor deposition chamber cleaning system as described in claim 2 wherein one powered electrode is disposed along the central axis of said chamber and two or more grounded electrodes are disposed within said chamber equidistant from each other and equidistant from said powered electrode.

5. A chemical vapor deposition chamber cleaning system as described in claim 2 wherein said grounded electrode is disposed along the central axis of said chamber and two or more powered electrodes are disposed within said chamber equidistant from each other and equidistant from said powered electrode.

6. A chemical vapor deposition chamber cleaning system as described in claim 2 wherein two powered electrodes and two grounded electrodes are disposed within said chamber, said powered electrodes being disposed in diametric opposition relative to the central axis of said chamber, said grounded electrodes being disposed in diametric opposition relative to the central axis of said chamber, and each said grounded electrode being disposed equidistant from said powered electrodes 7. A chemical vapor deposition chamber cleaning system as described in claim 1 wherein each of said electrodes are composed of a conductive material which reacts with said plasma to create a gaseous compound.

8. A chemical vapor deposition chamber cleaning system as described in claim 7, wherein said electrodes are composed of a material selected from the group consisting of silicon, carbon or silicon carbide.

9. A chemical vapor deposition chamber cleaning system as described in claim 7 wherein one powered electrode and one grounded electrode are disposed within said chamber.

10. A chemical vapor deposition chamber cleaning system as described in claim 7 wherein said powered electrode is disposed along the central axis of said chamber and two or more grounded electrodes are disposed within said chamber equidistant from each other and equidistant from said powered electrode.

11. A chemical vapor deposition chamber cleaning system as described in claim 7 wherein grounded electrode is disposed along the central axis of said chamber and two or more powered electrodes are disposed within said chamber equidistant from each other and equidistant from said powered electrode.

12. A chemical vapor deposition chamber cleaning system as described in claim 7 wherein two powered electrodes and two grounded electrodes are disposed within said chamber, said powered electrodes being disposed in diametric opposition relative to the central axis of said chamber, said grounded electrodes being disposed in diametric opposition relative to the central axis of said chamber, and each said grounded electrode being disposed equidistant from said powered electrodes.

13. A chemical vapor deposition chamber cleaning system for the in-situ cleaning of either LPCVD tube chambers where said LPCVD tube is situated in a furnace that utilizes electrical heating elements for heating said LPCVD tube and where the heating elements of said furnace are situated about the exterior of said LPCVD tube, or RPE bell jar chambers where said RPE bell jar is situated in the interior of a cylindrical bank of quartz lamps having metallic reflectors utilized to radiantly heat a susceptor situated in the interior of said RPE bell jar, or RPE bell jar chambers where said RPE bell jar is circumferentially wrapped by radio frequency induction coils used to heat a susceptor situated in the interior of said RPE bell jar by radio frequency induction, comprising:

a base member formed to create a vacuum seal upon engagement with the loading end of said chamber;

at least one powered electrode formed to protrude from said base member into said chamber and to extend substantially throughout the length of said chamber;

a means for introducing a plasma forming gas into said chamber;

a means to evacuate said chamber such that a plasma can be created within said chamber;

a first electrical network formed to connect as a grounded electrode said heating elements, or said metallic quartz lamp reflectors, or said RF induction coils;

a second electrical network formed to create a radio frequency electric field between said powered electrode and said grounded electrode, whereby a plasma is created in said chamber by the interaction of said gas and said RF field, said plasma acting to etch unwanted deposits from the inner wall of said chamber.

14. A chemical vapor deposition chamber cleaning system for the in-situ cleaning of LPCVD tube chambers or RPS bell jar chambers comprising:

a base member formed to create a vacuum seal upon engagement with the loading end of said chamber;

at least one powered electrode formed to protrude into said chamber;

at least one grounded electrode formed to protrude into said chamber;

a means for introducing a plasma forming gas into said chamber;

a means to evacuate said chamber such that a plasma can be created within said chamber;

an electrical network formed to create a radio frequency electrical field between said powered electrode and said grounded electrode, whereby a plasma is created in said chamber by the interaction of said gas and said RF field, said plasma acting to etch unwanted deposits from the inner wall of said chamber;

wherein said powered electrode and said grounded electrode are co-axially such that said grounded electrode is formed as a hollow tube and said powered electrode extends co-axially through the center of said grounded electrode tube;

said grounded electrode terminating within said chamber in a radially extending grounded electrode plate and said powered electrode terminating within said chamber in a radially extending powered electrode plate whereby said electric field is primarily created between said grounded plate and said powered plate;

said means for introducing said gas including a hollow quartz glass gas tube which is co-axially disposed between said grounded electrode and said powered electrode and acts to electrically insulate said electrodes; said gas tube having a gas emission orifice disposed proximate said grounded plate and powered plate to emit gas between said plates; and wherein said grounded electrode is formed to slideably protrude through said base plate;

whereby said electrodes may be incrementally extended throughout the length of said chamber by gradual extension of said electrodes through said base plate.

15. A chemical vapor deposition chamber cleaning system as described in claim 14 wherein a cylindrical covering is disposed over the circumferential edges of said plates, said covering having plasma emission holes formed radially therethrough to emit plasma towards the inner surface of said chamber wall.

16. A chemical vapor deposition chamber system for the in-situ cleaning of LPCVD tube chambers or RPE bell jar chambers comprising:

a base member formed to create a vacuum seal upon engagement with the loading end of said chamber, said base member having a hole formed centrally therethrough;

a quartz tube formed to protrude through said hole in said base member and extend axially within said chamber, said quartz tube being sealed at the end thereof which protrudes into said chamber, and said quartz tube engaging the base member to form a vacuum seal at said engagement with said base member;

at least one powered electrode formed to protrude into said chamber and being disposed within said quartz tube;

at least one grounded electrode formed to protrude into said chamber and being disposed within said quartz tube;

a means for introducing a plasma forming gas into said chamber;

a means to evacuate said chamber such that a plasma can be created within said chamber;

an electrical network formed to create a radio frequency electrical field between said powered electrode and said grounded electrode, whereby a plasma is created in said chamber by the interaction of said gas and said RF field, said plasma acting to etch unwanted deposits from the inner wall of said chamber.

17. A chemical vapor deposition chamber cleaning system as described in claim 16 wherein said powered and grounded electrodes extend axially substantially throughout the length of said tube and are disposed proximate the inner surface of said tube; and means is provided to hold said electrodes in a substantially fixed position.

18. A chemical vapor deposition chamber cleaning system as described in claim 16 wherein said powered electrodes and grounded electrodes are formed as alternating bands which are disposed circumferentially proximate the inner surface of said tube; and means is provided to hold said electrodes in a substantially fixed position.

19. A chemical vapor deposition chamber cleaning system as described in claim 16 wherein two powered electrodes are disposed within said tube and two grounded electrodes are disposed within said tube, said powered electrodes being diametrically opposed and said grounded electrodes being also diametrically opposed.

* * * * *